United States Patent
Nakamura

(10) Patent No.: US 10,930,325 B2
(45) Date of Patent: Feb. 23, 2021

(54) TWO-STAGE GATED-DIODE SENSE AMPLIFIER

(71) Applicant: INTERNATIONAL BUSINESS MACHINES CORPORATION, Armonk, NY (US)

(72) Inventor: Yutaka Nakamura, Kyoto (JP)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/257,562

(22) Filed: Jan. 25, 2019

(65) Prior Publication Data

US 2020/0243120 A1    Jul. 30, 2020

(51) Int. Cl.

| | |
|---|---|
| *G11C 7/14* | (2006.01) |
| *G11C 7/06* | (2006.01) |
| *G11C 5/14* | (2006.01) |
| *G11C 11/4091* | (2006.01) |
| *H01L 29/739* | (2006.01) |
| *G11C 11/419* | (2006.01) |

(52) U.S. Cl.
CPC ............ *G11C 7/067* (2013.01); *G11C 5/14* (2013.01); *G11C 11/4091* (2013.01); *G11C 11/419* (2013.01); *H01L 29/7391* (2013.01)

(58) Field of Classification Search
CPC ....... G11C 7/067; G11C 5/14; G11C 11/4091; G11C 11/419; H01L 29/7391
USPC .................................................. 365/189.011
See application file for complete search history.

(56) References Cited

U.S. PATENT DOCUMENTS

| | | | |
|---|---|---|---|
| 8,374,043 B2 | 2/2013 | Lee et al. | |
| 8,941,412 B2 | 1/2015 | Luk et al. | |
| 9,225,378 B2* | 12/2015 | Burgener | H03K 17/063 |
| 2006/0220459 A1 | 10/2006 | Kulasekeram | |
| 2009/0103382 A1 | 4/2009 | Luk et al. | |
| 2011/0248697 A1* | 10/2011 | Kajigaya | G11C 7/04 |
| | | | 323/311 |
| 2015/0145584 A1 | 5/2015 | Kim | |
| 2016/0006395 A1 | 1/2016 | Kim et al. | |

OTHER PUBLICATIONS

Luk et al., Gated-Diode Amplifiers, IEEE Transactions on Circuits and Systems II: Express Briefs, May 2005, pp. 266-270, vol. 52, Issue: 5, IEEE.

(Continued)

*Primary Examiner* — Harry W Byrne
(74) *Attorney, Agent, or Firm* — Tutunjian & Bitetto, P.C.; Randall Bluestone

(57) ABSTRACT

A two-stage gated-diode sense amplifier includes a first transistor connected to an input node, a second transistor connected to a boost node, the input node and a setting line, a first inverter including a third transistor connected to a power supply voltage (VDD), a first output corresponding to the first inverter and the setting line, and a fourth transistor connected to ground, the first output and the setting line, a fifth transistor connected to the first output, the first transistor and the boost node, and a second associated with a second output corresponding to the second inverter, the second inverter including a sixth transistor connected to VDD, the second output and the first output, and a seventh transistor connected to ground, the second output and the first output.

8 Claims, 6 Drawing Sheets

(56) References Cited

OTHER PUBLICATIONS

Stepanovic et al., Gated-diode Sense Amplifier for Robust Differential sensing in 6T SRAM, https://www.semanticscholar.org, 2007.
IBM, Diode Connect Negative Boost Sense Amplifier with Output Latch, IP.com Prior Art Database (https://priorart.ip.com/IPCOM/000185609), Jul. 29, 2009, pp. 1-4, IP.com.

* cited by examiner

TWO-STAGE GATED-DIODE SENSE AMPLIFIER

BACKGROUND

Technical Field

The present invention generally relates to semiconductor devices, and more particularly to sense amplifiers.

Description of the Related Art

In the context of computer memory, sense amplifiers are components of read circuitry on a memory chip used to read data from memory. Sense amplifiers are configured to sense low power signals from a bit-line representing a data bit (e.g., 1 or 0) stored in a memory cell, and amplify the small voltage to recognizable logical levels so that the data can be interpreted by logic.

In general, paired data lines can be used to improve noise immunity in data transfer or memories, such as, e.g., DRAM (dynamic random-access memory) or SRAM (static RAM), instead of single-ended data lines. Further, sense amplifiers working with limited voltage amplitude can be used for low power and high speed. However, in some cases, use of single-ended data line may be needed by virtue of wiring limitations.

SUMMARY

In accordance an embodiment of the present invention, a two-stage gated-diode sense amplifier is provided. The two-stage gated-diode sense amplifier includes a first transistor connected to an input node, and a second transistor having a source/drain connected to a boost node, a drain/source connected to the input node and a gate connected to a setting line. The two-stage gated-diode sense amplifier further includes a first inverter including a third transistor having a source/drain connected to a power supply voltage (VDD), a drain/source connected to a first output corresponding to the first inverter and a gate connected to the setting line, and a fourth transistor having a source/drain connected to ground, a drain/source connected to the first output and a gate connected to the setting line. The two-stage gated-diode sense amplifier further includes a fifth transistor having a source and drain connected to the first output and the gate of the first transistor, and a gate connected to the boost node. The two-stage gated-diode sense amplifier further includes a second inverter including a sixth transistor having a source/drain connected to VDD, a drain/source connected to a second output corresponding to the second inverter and a gate connected to the first output, and a seventh transistor having a source/drain connected to ground, a drain/source connected to the second output and a gate connected to the first output.

In accordance another embodiment of the present invention, a memory device is provided. The memory device include a memory cell, and a two-stage gated-diode sense amplifier operatively coupled to the memory cell. The two-stage gated-diode sense amplifier includes a first transistor connected to an input node, and a second transistor having a source/drain connected to a boost node, a drain/source connected to the input node and a gate connected to a setting line. The two-stage gated-diode sense amplifier further includes a first inverter including a third transistor having a source/drain connected to a power supply voltage (VDD), a drain/source connected to a first output corresponding to the first inverter and a gate connected to the setting line, and a fourth transistor having a source/drain connected to ground, a drain/source connected to the first output and a gate connected to the setting line. The two-stage gated-diode sense amplifier further includes a fifth transistor having a source and drain connected to the first output and the gate of the first transistor, and a gate connected to the boost node. The two-stage gated-diode sense amplifier further includes a second inverter including a sixth transistor having a source/drain connected to VDD, a drain/source connected to a second output corresponding to the second inverter and a gate connected to the first output, and a seventh transistor having a source/drain connected to ground, a drain/source connected to the second output and a gate connected to the first output.

In accordance yet another embodiment of the present invention, a method for implementing a two-stage gated-diode sense amplifier is provided. The method includes sensing, by a two-stage gated-diode sense amplifier, a signal, and amplifying, by the two-stage gated-diode sense amplifier, the sensed signal. The two-stage gated-diode sense amplifier includes a first transistor connected to an input node, and a second transistor having a source/drain connected to a boost node, a drain/source connected to the input node and a gate connected to a setting line. The two-stage gated-diode sense amplifier further includes a first inverter including a third transistor having a source/drain connected to a power supply voltage (VDD), a drain/source connected to a first output corresponding to the first inverter and a gate connected to the setting line, and a fourth transistor having a source/drain connected to ground, a drain/source connected to the first output and a gate connected to the setting line. The two-stage gated-diode sense amplifier further includes a fifth transistor having a source and drain connected to the first output and the gate of the first transistor, and a gate connected to the boost node. The two-stage gated-diode sense amplifier further includes a second inverter including a sixth transistor having a source/drain connected to VDD, a drain/source connected to a second output corresponding to the second inverter and a gate connected to the first output, and a seventh transistor having a source/drain connected to ground, a drain/source connected to the second output and a gate connected to the first output.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
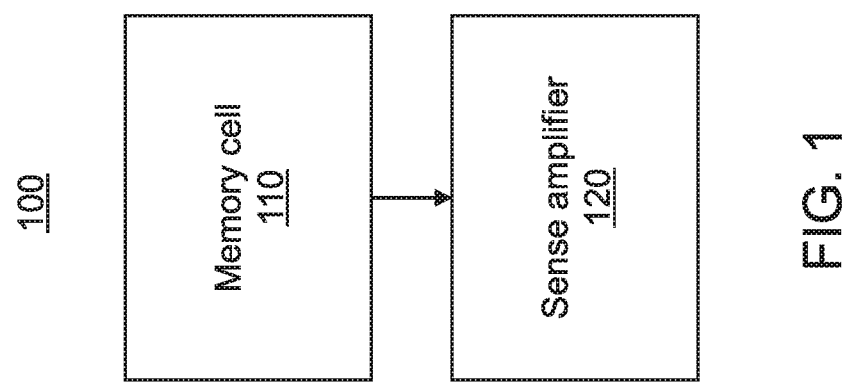
FIG. 1 is a block diagram of a memory device including a memory cell and a sense amplifier, in accordance with an embodiment of the present invention.

Gate-body capacitance ($C_{GB}$) and overlap capacitance between gate and source/drain regions ($C_{OV}$) can be present at a gated-diode structure in NMOS or PMOS configurations. $C_{GB}$ functions to amplify a high logic level (e.g., logic 1) more than a low logic level (e.g., logic 0) by non-linearity, while $C_{OV}$ functions to provide the same amplification regardless of logic level.

The embodiments described herein provide for sensor amplifiers that can sense and amplify a signal (e.g., a limited voltage amplitude signal) utilizing a two-stage gated-diode structure. Sense amplifiers in accordance with the embodiments described herein can cancel out unexpected amplification of $C_{OV}$ by two amplification stages (e.g., positive and negative stages) using two gated-diode structures (e.g., NMOS and PMOS gated-diode structures) to one amplification stage (e.g., positive). At the same time, improvements in $C_{GB}$ can be realized, resulting in lower power consumption by limited voltage amplitude of the input node and cycle time reduction.

Sense amplifiers in accordance with the embodiments described can provide for a single isolation device that can isolate the input node and boost node, as opposed to two isolation devices, since the input node voltage amplitude can be limited. Additionally, four sets of inverters (8 devices) are not necessary, and second amplification can be done by adding three devices including an inverter and a transistor.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

With reference to FIG. 1, a block diagram is provided illustrating a memory device 100. As shown, the memory device 100 can include a memory cell 110 and a sense amplifier 120 operatively coupled to the memory cell 110 to sense and amplify a signal from the memory cell 110. In one embodiment, the sense amplifier 120 can include a two-stage gated-diode sense amplifier. Further details regarding the memory cell 110 and the sense amplifier 120 will now be provided below with reference to FIGS. 2-6.

Figure 2:
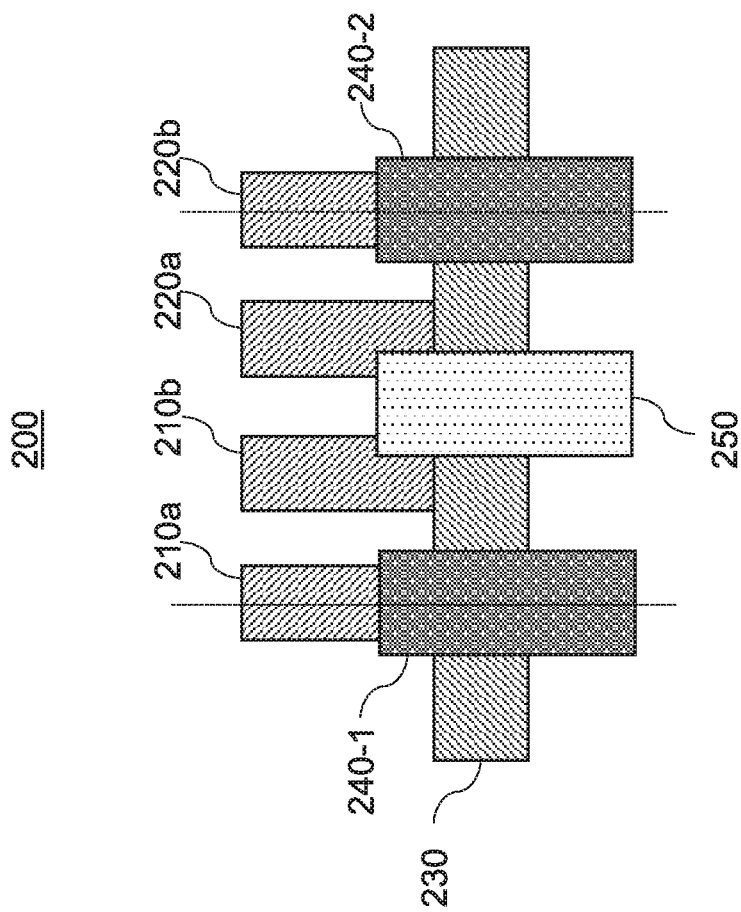
FIG. 2 is a block diagram of a memory cell, in accordance with an embodiment of the present invention.

With reference to FIG. 2, a memory cell 200 is shown (e.g., the memory cell 110 of FIG. 1). The memory cell shown in FIG. 2 is purely exemplary, and the embodiments described herein can be applied to any suitable memory cell.

In one embodiment, the memory cell 200 includes dynamic RAM (DRAM) cell. For example, the memory cell 200 can illustratively employ a DRAM memory cell design having a storage cell size of $6F^2$, where F refers to the feature of the semiconductor device manufacturing technology (e.g., 90/65/28 nm). Thus, $F^2$ is the square of the feature, which is a minimum unit size of the manufacturing technology. However, the memory cell 200 can include any suitable memory cell in accordance with the embodiments described herein.

The memory cell 200 can include pairs of bit-lines (BLs) and complementary bit-lines (*BLs), including a first pair having a first BL 210a and a first *BL 210a, and a second pair having a second BL 220a and a second *BL 220b. The memory cell 200 further includes word-line (WL) 230, a first data-line (DL) 240-1, a second DL 240-2 and power supply voltage (VDD)/ground (GND) 250.

In DRAM, single-ended data line (DL) implementation can be needed by tight metal pitch, especially in wide input/output (I/O) access cases. Thus, a two-stage gated-diode sense amplifier can be used in DRAM, since it is single-ended line. Full-rail amplitude can consume large power, so limited amplitude can be preferable, especially in wide I/O access cases.

Figure 3:
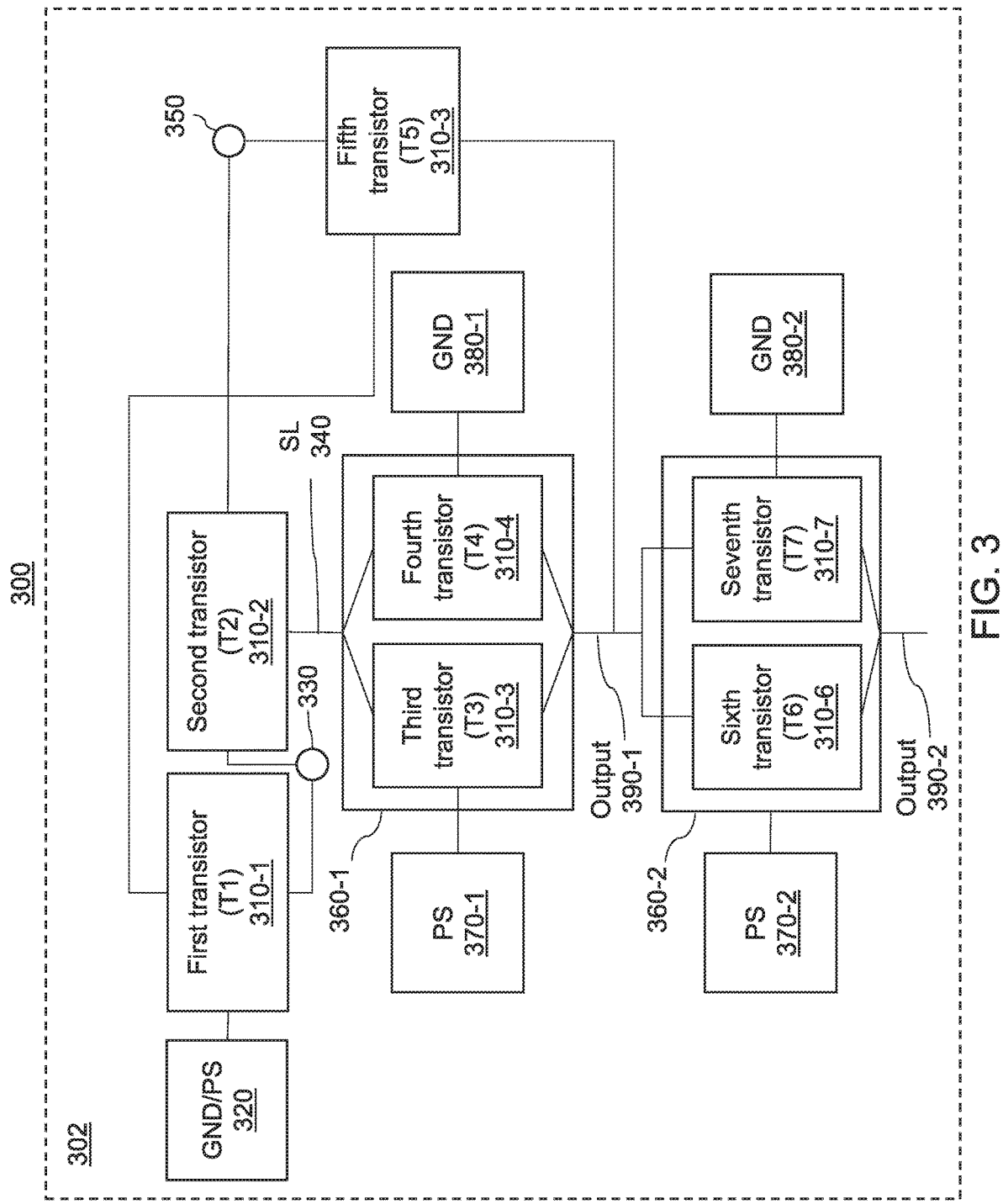
FIG. 3 is a block diagram of a portion of a sense amplifier, in accordance with an embodiment of the present invention.

With reference to FIG. 3, a block diagram is provided illustrating a sense amplifier 300. For example, the sense amplifier 300 can be, e.g., a primary sense amplifier or a secondary sense amplifier. The sense amplifier 300 can sense a signal (e.g., a low power signal) that represents a data bit (e.g., 1 or 0) stored in a memory cell. The sensed signal can then be amplified by the sense amplifier. The amplification can be performed so that signal can be interpreted by logic outside of memory.

More specifically, a portion 302 of the sense amplifier 300 is shown, including a first transistor (T1) 310-1 and a second transistor (T2) 310-2.

T1 310-1 can be connected to one of ground and a power supply voltage (GND/PS) 320, and an input node 320. More specifically, T1 310-1 can have one of a source and drain (source/drain) connected to GND/PS 320, and the other of the source and drain (drain/source) connected to the input node 330. Illustratively, GND can be, e.g., 0 V.

T2 310-2 can be connected to input node 330, a setting line (SL) 340 and a boost node 350. More specifically, T2 310-2 can have a source/drain connected to the boost node 350, a drain/source connected to the input node 330, and a gate connected to SL 340.

As further shown, the portion 302 can further include a first inverter 360-1 including a third transistor (T3) 310-3 and a fourth transistor (T4) 310-4. More specifically, T3 310-3 can have a source/drain connected to PS 370-1, a drain/source connected to a first output 390-1 corresponding to the first inverter 360-1, and a gate connected to the setting line 340, and T4 310-4 can have a source/drain connected to GND 380-1, a drain/source connected to the first output 390-1, and a gate connected to the setting line 340. In one embodiment, T3 310-3 can include a p-type metal-oxide semiconductor (PMOS) device and, T4 310-4 can include an n-type metal-oxide semiconductor (NMOS) device. For example, T3 310-3 can be a p-type field-effect transistor (PFET), while T4 310-4 can be an n-type field-effect transistor (NFET). However, such an embodiment should not be considered limiting.

As further shown, the portion 302 can further include a fifth transistor (T5) 310-5. More specifically, T5 310-5 can have a source and drain connected to the first output 390-1 and the gate of T1 310-1, and a gate connected to the boost node 350.

In one embodiment, T1 310-1, T2 310-2 and T5 310-5 can include NMOS devices. In this embodiment, T1 310-1 can be connected to ground (e.g., 0V), and the input node 330 can be driven/pre-charged at ground. In another embodiment, T1 310-1, T2 310-2 and T5 310-5 can include PMOS devices. In this embodiment, T1 310-1 can be connected to VDD (e.g., 1V), and the input node 330 can be driven/pre-charged at VDD.

As further shown, the portion 302 can further include a second inverter 360-2 including a sixth transistor (T6) 310-6 and a seventh transistor (T7) 310-7. More specifically, T6 310-6 can have a source/drain connected to PS 370-2, a drain/source connected to a second output 390-2 corresponding to the second inverter 360-2, and a gate connected to the setting line 340, and T7 310-7 can have a source/drain connected to GND 380-2, a drain/source connected to the second output 390-2, and a gate connected to the setting line 340. In one embodiment, T6 310-6 can include a PMOS device and T7 310-7 can include an NMOS device. For example, T6 310-6 can be a PFET, while T7 310-7 can be an NFET. However, such an embodiment should not be considered limiting.

As stated above, FIG. 3 depicts an overview of a portion 302 of a sense amplifier 300. Additional components that are not shown in FIG. 3, such as, e.g., other transistors and nodes, can be included to complete the sense amplifier 300. For example, in some embodiments, the sense amplifier 300 can include, e.g., fourteen transistors, including T1-T5. However, it should be understood and appreciated that the number of transistors can be less than or greater than fourteen, and that the sense amplifier 300 can include any suitable number of transistors in accordance with the embodiments described herein.

The sense amplifier 300 can cancel out unexpected amplification of $C_{OV}$ by two amplification stages (e.g., positive and negative stages) using two gated-diode structures (e.g., NMOS and PMOS gated-diode structures) to one amplification stage (e.g., positive). At the same time, improvements in $C_{GB}$ can be realized, resulting in lower power consumption by limited voltage amplitude of the input node and cycle time reduction.

Further details regarding the sense amplifier 300, including exemplary sense amplifiers including the portion 302 of the sense amplifier 300, will now be described with reference to FIGS. 4-6.

Figure 4:
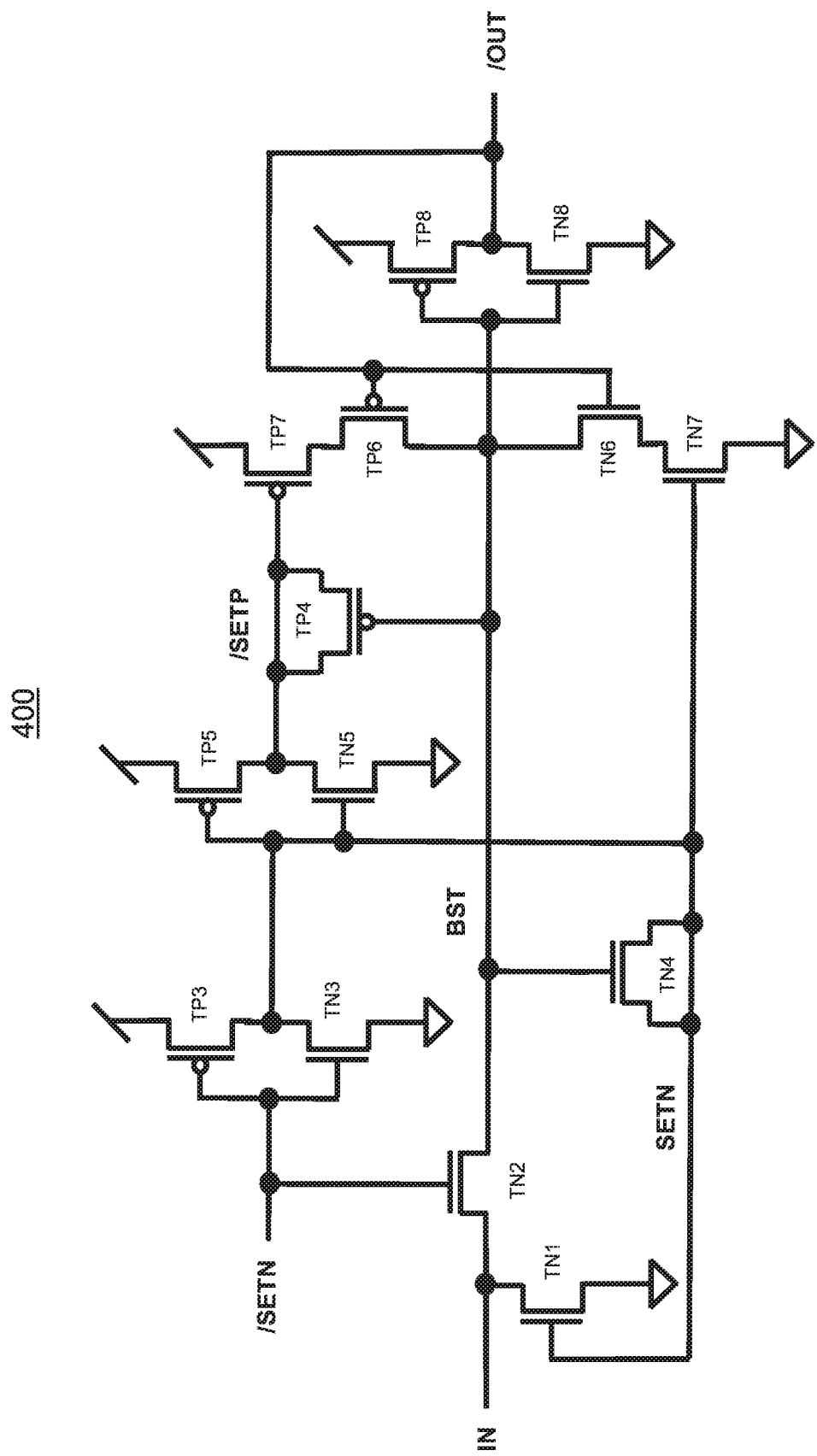
FIG. 4 is a schematic of a two-stage gated-diode sense amplifier, in accordance with an embodiment of the present invention.

With reference to FIG. 4, a schematic of a sense amplifier 400 is provided in accordance with an embodiment of the present invention. As will be described in further detail, the sense amplifier 400 is a two-stage gated-diode sense amplifier including fourteen transistors, two inverters each formed from two respective pairs of the fourteen transistors, and a feedback latch formed from six of the fourteen transistors. Illustratively, the sense amplifier 400 can be implemented in a memory device. For example, the sense amplifier 400 can be implemented in, e.g., DRAM and/or SRAM.

As shown, the sense amplifier 400 can include a first transistor TN1 having a source connected to ground (GND), a drain connected to an input node (IN) and a gate, and a second transistor TN2 having a source connected to a boost node (BST), a drain connected to IN, and a gate connected to a setting line (/SETN). In one embodiment, IN is pre-charged to GND. In this illustrative embodiment, TN1 and TN2 include n-type metal-oxide semiconductor (NMOS) devices. For example, TN1 and TN2 can be n-type field-effect transistors (NFETs). However, such an embodiment should not be considered limiting.

The sense amplifier 400 can further include a first inverter (e.g., cross-coupled inverter). As shown, the first inverter includes a third transistor TP3 having a source connected to a power supply voltage (VDD), a drain connected to a first output (SETN) associated with the first inverter and a gate connected to /SETN, and a fourth transistor TN3 having a source connected to GND, a drain connected to SETN, and a gate connected to /SETN. In this illustrative embodiment, TP3 includes a p-type metal-oxide semiconductor (PMOS) device, and TN3 is an NMOS device. For example, TP3 can be a p-type field-effect transistors (PFET), while TN3 can be an NFET. However, such an embodiment should not be considered limiting.

The sense amplifier 400 can further include a fifth transistor TN4 having a source and drain connected to SETN and the gate of TN1, and a gate connected to BST. In this illustrative embodiment, TN4 includes an NMOS device. For example, TN4 can be an NFET. However, such an embodiment should not be considered limiting.

The sense amplifier 400 can further include a second inverter (e.g., a cross-coupled inverter). As shown, the second inverter includes a sixth transistor TP5 having a source connected to VDD, a drain connected to a second output (/SETP) associated with the second inverter and a gate connected to SETN, and a seventh transistor TN5 having a source connected to GND, a drain connected to /SETP and a gate connected to SETN. In this illustrative embodiment, TP5 includes a PMOS device and TN5 includes an NMOS device. For example, TP5 can be a PFET, while TN3 can be an NFET. However, such an embodiment should not be considered limiting.

The sense amplifier 400 can further include an eighth transistor TP4 having a source and drain connected to /SETP and a gate connected to BST. In this illustrative embodiment, TP4 includes a PMOS device. For example, TP4 can be a PFET. However, such an embodiment should not be considered limiting.

The sense amplifier 400 can further include a feedback latch. The feedback latch is formed from a ninth transistor TP7 having a source connected to VDD, a drain and a gate connected to /SETP, a tenth transistor TP6 having a source connected to the drain of TP7, a drain connected to BST and a gate connected to a third output (/OUT), an eleventh transistor TN6 having a source and drain connected to BST and a gate connected to /OUT, a twelfth transistor TN7 having a source connected to GND, a drain connected to the source of TN6 and a gate connected to SETN, a thirteenth transistor TP8 having a source connected to VDD, a drain connected to /OUT and a gate connected to BST, and a fourteenth transistor TN8 having a source connected to GND, a drain connected to /OUT and a gate connected to BST. In this illustrative embodiment, TP6-TP8 include PMOS devices (e.g., PFETS) and TN6-TN8 include NMOS devices (e.g., NFETS). However, such an embodiment should not be considered limiting.

In standby, /SETN is high and TN2 turns on, both TP7/TN7 are turned off (/SETP is high and SETN is low). Therefore, BST voltage is the same as IN, and the feedback latch including TN6-8/TP6-8 is disabled. IN is driven at 0V when data is low, while it is driven, e.g., at a couple hundred millivolts (mVs) when data is high. When /SETN goes low then SETN goes high after first inverter (TP3/TN3) delay, BST is isolated, TN1 simultaneously turns on, and then IN node is pre-charged at 0V. $C_{GB}$ amplification does not occur when BST is 0V, but does occur when BST is at, e.g., a couple hundred mV due to non-linearity characteristics of gated-diode structure. In both cases, unexpected $C_{OV}$ amplification occurs. In the second amplification stage, /SETP goes low from high, reversing $C_{OV}$ amplification.

Figure 5:
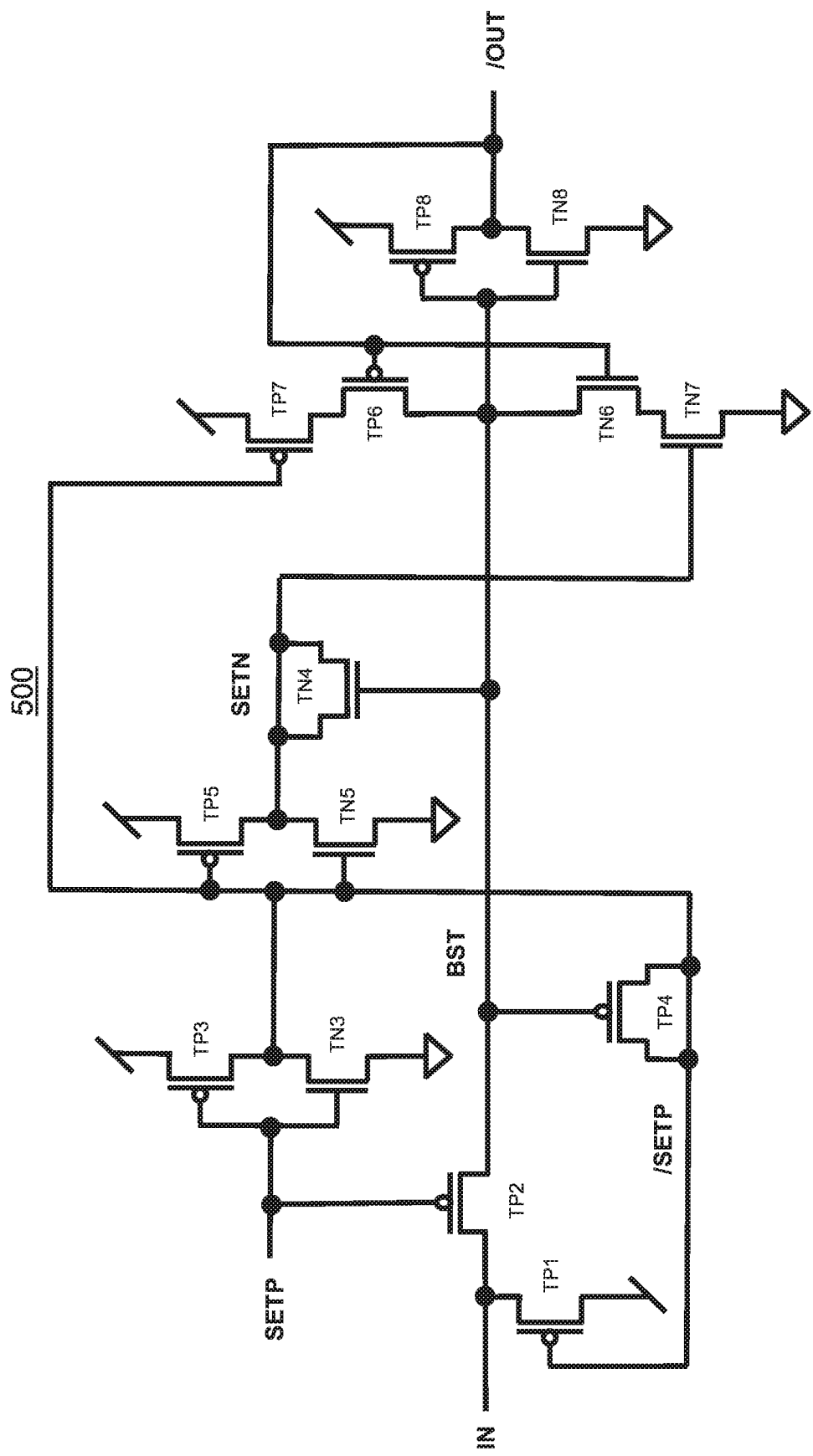
FIG. 5 is a schematic of a two-stage gated-diode sense amplifier, in accordance with another embodiment of the present invention.

With reference to FIG. 5, a schematic of a sense amplifier 500 is provided in accordance with another embodiment of the present invention. As will be described in further detail, and similar to the sense amplifier 400 of FIG. 4, the sense amplifier 500 is a two-stage gated-diode sense amplifier including fourteen transistors, two inverters each formed from two respective pairs of the fourteen transistors, and a feedback latch formed from six of the fourteen transistors. Illustratively, the sense amplifier 500 can be implemented in a memory device. For example, the sense amplifier 500 can be implemented in, e.g., DRAM and/or SRAM.

As shown, the sense amplifier 500 can include a first transistor TP1 having a source connected to an input node (IN), a drain connected to a power supply (VDD) and a gate, and a second transistor TP2 having a source connected to an input node, a drain connected to a boost node (BST), a and a gate connected to a setting line (SETP). In this embodiment, IN is driven at VDD (e.g., 1 V). In this illustrative embodiment, TP1 and TP2 include p-type metal-oxide semiconductor (PMOS) devices. For example, TP1 and TP2 can be p-type field-effect transistors (PFETs). However, such an embodiment should not be considered limiting.

The sense amplifier 500 can further include a first inverter (e.g., cross-coupled inverter). As shown, the first inverter includes a third transistor TP3 having a source connected to a power supply voltage (VDD), a drain connected to a first output (/SETP) associated with the first inverter and a gate connected to SETP, and a fourth transistor TN3 having a source connected to GND, a drain connected to /SETP, and a gate connected to SETP. In this illustrative embodiment, TP3 includes a p-type metal-oxide semiconductor (PMOS) device, and TN3 is an NMOS device. For example, TP3 can be a p-type field-effect transistors (PFET), while TN3 can be an NFET. However, such an embodiment should not be considered limiting.

The sense amplifier 500 can further include a fifth transistor TP4 having a source and drain connected to /SETP and the gate of TP1, and a gate connected to BST. In this illustrative embodiment, TP4 includes a PMOS device. For example, TP4 can be an PFET. However, such an embodiment should not be considered limiting.

The sense amplifier 500 can further include a second inverter (e.g., a cross-coupled inverter). As shown, the second inverter includes a sixth transistor TP5 having a source connected to VDD, a drain connected to a second output (SETN) associated with the second inverter and a gate connected to /SETP, and a seventh transistor TN5 having a source connected to GND, a drain connected to SETN and a gate connected to /SETP. In this illustrative embodiment, TP5 includes a PMOS device and TN5 includes an NMOS device. For example, TP5 can be a PFET, while TN3 can be an NFET. However, such an embodiment should not be considered limiting.

The sense amplifier 500 can further include an eighth transistor TN4 having a source and drain connected to SETN and a gate connected to BST. In this illustrative embodiment, TN4 includes an NMOS device. For example, TN4 can be an NFET. However, such an embodiment should not be considered limiting.

The sense amplifier 500 can further include a feedback latch. The feedback latch is formed from a ninth transistor TP7 having a source connected to VDD, a drain and a gate connected to /SETP, a tenth transistor TP6 having a source connected to the drain of TP7, a drain connected to BST and a gate connected to a third output (/OUT), an eleventh transistor TN6 having a source and drain connected to BST and a gate connected to /OUT, a twelfth transistor TN7 having a source connected to GND, a drain connected to the source of TN6 and a gate connected to SETN, a thirteenth transistor TP8 having a source connected to VDD, a drain connected to /OUT and a gate connected to BST, and a fourteenth transistor TN8 having a source connected to GND, a drain connected to /OUT and a gate connected to BST. In this illustrative embodiment, TP6-TP8 include PMOS devices (e.g., PFETS) and TN6-TN8 include NMOS devices (e.g., NFETS). However, such an embodiment should not be considered limiting.

In standby, SETP is low and TP2 turns on, both TP7/TN7 are turned off (/SETP is high and SETN is low). Therefore, BST voltage is the same as IN, and the feedback latch including TN6-8/TP6-8 is disabled. IN is driven at VDD (e.g., 1 V) when data is high, while it is driven, e.g., at a couple hundred millivolts (mVs) below VDD when data is low. When SETP goes high then /SETP goes low after first inverter (TP3/TN3) delay, BST is isolated, TP1 simultaneously turns on, and then IN node is pre-charged at VDD (e.g., 1 V). $C_{GB}$ amplification does not occur when BST is at VDD (e.g., 1 V), but does occur when BST is at, e.g., a couple hundred mV below VDD due to non-linearity characteristics of gated-diode structure. In both cases, unexpected $C_{OV}$ amplification occurs. In the second amplification stage, SETN goes high from low, reversing $C_{OV}$ amplification.

As has been described in FIGS. 3-5, two-stage gated-diode sense amplifiers in accordance with the embodiments described herein can include a single isolation device that can isolate the input node and the boost node, as opposed to two isolation devices, since input node voltage amplitude is limited. Additionally, four sets of inverters (8 devices) are not necessary, and the second amplification stage can be done by using a second inverter.

Figure 6:
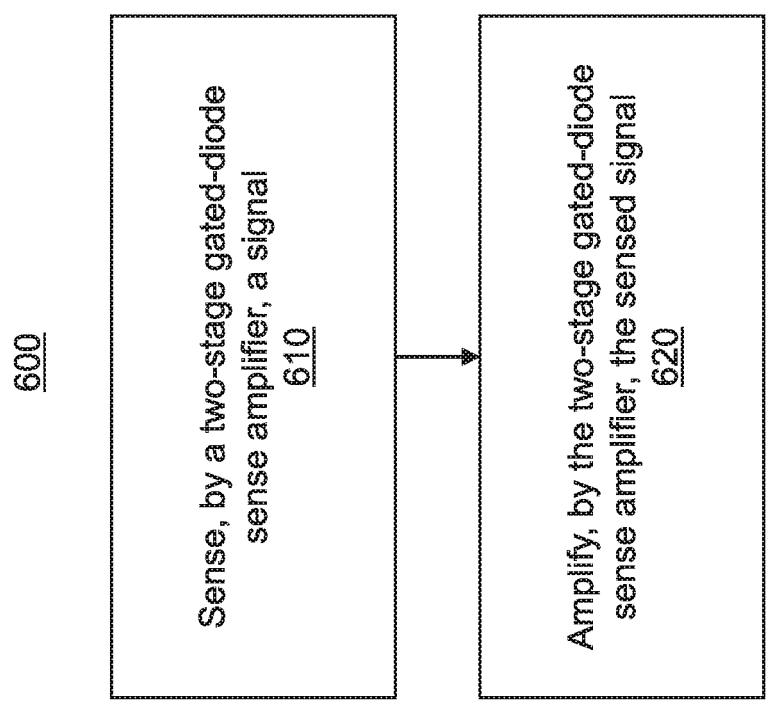
FIG. 6 is a block/flow diagram of a system/method for implementing a two-stage gated-diode sense amplifier, in accordance with an embodiment of the present invention.

With reference to FIG. 6, a block/flow diagram is provided illustrating a system/method 600 for implementing a two-stage gated diode sense amplifier, such one of the sense amplifiers described above with reference to FIGS. 3-5. The system/method 600 can be performed to cancel out unexpected amplification of $C_{OV}$ by two amplification stages (e.g., positive and negative stages) using two gated-diode structures (e.g., NMOS and PMOS gated-diode structures) to one amplification stage (e.g., positive). At the same time, improvements in $C_{GB}$ can be realized, resulting in lower power consumption by limited voltage amplitude of the input node and cycle time reduction.

At block 610, a signal is sensed by a two-stage gated-diode sense amplifier. The signal can be a low power signal received from the bit-line that represents a data bit (e.g., 1 or 0) stored in a memory cell.

The sense amplifier can include a first transistor connected to an input node. More specifically, the first transistor can have a source/drain connected to ground or a power supply voltage (VDD), a drain/source connected to an input node and a gate.

The sense amplifier can further include a second transistor having a source/drain connected to a boost node, a drain/source connected to the input node and a gate connected to a setting line.

The sense amplifier can further include a first inverter (e.g., cross-coupled inverter) corresponding to a first output. The first inverter can include a third transistor having a source/drain connected to VDD, a drain/source connected to the first output and a gate connected to the setting line, and a fourth transistor having a source/drain connected to ground, a drain/source connected to the first output and a gate connected to the setting line. In one embodiment, the third transistor can include a PMOS device and the fourth transistor can include an NMOS device. For example, the third transistor can be a PFET, while the fourth transistor can be an NFET. However, such an embodiment should not be considered limiting.

The sense amplifier can further include a fifth transistor having a source and drain connected to the first output and the gate of the first transistor, and a gate connected to the boost node.

The sense amplifier can further include a second inverter (e.g., a cross-coupled inverter) corresponding to a second output. The second inverter can include a sixth transistor having a source connected to VDD, a drain connected to the second output and a gate connected to the setting line, and a seventh transistor having a source connected to ground, a drain connected to the second output and a gate connected to the first output. In one embodiment, the sixth transistor can include a PMOS device and the seventh transistor can include an NMOS device. For example, the sixth transistor can be a PFET, while the seventh transistor can be an NFET. However, such an embodiment should not be considered limiting.

The sense amplifier can further include an eighth transistor having a source and drain connected to the second output and a gate connected to the boost node.

The sense amplifier can further include a feedback latch including a ninth transistor having a source connected to VDD and a drain and gate connected to the second output, a tenth transistor having a source connected to the drain of the ninth transistor, a drain connected to the boost node and a gate connected to a third output (e.g., /OUT), an eleventh transistor having a source and drain connected to the boost node and a gate connected to the third output, a twelfth transistor having a source connected to ground, a drain connected to the source of the eleventh transistor and a gate connected to the first output, a thirteenth transistor having a source connected to VDD, a drain connected to the third output and a gate connected to the boost node, and a fourteenth transistor having a source connected to ground, a drain connected to the third output and a gate connected to the boost node.

More specifically, the ninth transistor can include a PMOS device (e.g., a PFET), the tenth transistor can include a PMOS device (e.g., a PFET), the eleventh transistor can include an NMOS device (e.g., an NFET), the twelfth transistor can include an NMOS device (e.g., an NFET), the thirteenth transistor can include a PMOS device (e.g., a PFET), and the fourteenth transistor can include an NMOS device (e.g., an NFET).

In one embodiment, the first, second and fifth transistors can include NMOS devices and the eighth transistor can include a PMOS device. In this embodiment, the first transistor can be connected to ground (e.g., 0V), and the input node can be driven/pre-charged at ground. Further details regarding this embodiment are described above with reference to FIG. 4.

In another embodiment, the first, second a fifth transistors can include PMOS devices and the eighth transistor can include a PMOS device. In this embodiment, the first transistor can be connected to VDD (e.g., 1V), and the input node can be driven/pre-charged at VDD. Further details regarding this embodiment are described above with reference to FIG. 5.

Further details regarding the two-stage gated-diode sense amplifier are described above with reference to FIGS. 3-5.

At block 620, the sensed signal is amplified by the two-stage gated-diode sense amplifier. The amplification is performed so that the signal can be interpreted by logic outside of the memory.

Having described preferred embodiments of two-stage gated-diode sense amplifiers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A two-stage gated-diode sense amplifier, comprising:
   a first transistor connected to an input node;
   a second transistor having a source/drain connected to a boost node, a drain/source connected to the input node and a gate connected to a setting line;
   a first inverter including a third transistor having a source/drain connected to a power supply voltage (VDD), a drain/source connected to a first output corresponding to the first inverter and a gate connected to the setting line, and a fourth transistor having a source/drain connected to ground, a drain/source connected to the first output and a gate connected to the setting line;
   a fifth transistor having a source and drain connected to the first output and the gate of the first transistor, and a gate connected to the boost node; and
   a second inverter including a sixth transistor having a source/drain connected to VDD, a drain/source connected to a second output corresponding to the second inverter and a gate connected to the first output, and a seventh transistor having a source/drain connected to ground, a drain/source connected to the second output and a gate connected to the first output.

2. The two-stage gated-diode sense amplifier of claim 1, further comprising an eighth transistor having a source and drain connected to the second output and a gate connected to the boost node.

3. The two-stage gated-diode sense amplifier of claim 2, further comprising a feedback latch including:
   a ninth transistor having a source/drain connected to VDD, a drain/source, and a gate connected to the second output;
   a tenth transistor having a source/drain connected to the drain/source of the ninth transistor, a drain/source connected to the boost node and a gate connected to a third output;
   an eleventh transistor having a source and drain connected to the boost node and a gate connected to the third output;
   a twelfth transistor having a source/drain connected to ground, a drain/source connected to the source/drain of the eleventh transistor and a gate connected to the first output;
   a thirteenth transistor having a source/drain connected to VDD, a drain connected to the third output and a gate connected to the boost node; and
   a fourteenth transistor having a source/drain connected to ground, a drain/source connected to the third output and a gate connected to the boost node.

4. The two-stage gated diode sense amplifier of claim 3, wherein:
   the third transistor includes a p-type field-effect transistor (PFET);
   the fourth transistor includes an n-type field-effect transistor (NFET);
   the sixth transistor includes a PFET;
   the seventh transistor includes an NFET;
   the ninth transistor includes a PFET;
   the tenth transistor includes a PFET;
   the eleventh transistor includes an NFET;
   the twelfth transistor includes an NFET;
   the thirteenth transistor includes a PFET; and
   the fourteenth transistor includes an NFET.

5. The two-stage gated-diode sense amplifier of claim 4, wherein:
   the first transistor includes an NFET having a source/drain connected to ground and a drain/source connected to the input node;
   the second transistor includes an NFET;
   the fifth transistor includes an NFET;
   the eighth transistor includes a PFET.

6. The two-stage gated-diode sense amplifier of claim 5, wherein the input node is pre-charged at ground.

7. The two-stage gated-diode sense amplifier of claim 4, wherein:
   the first transistor includes a PFET having a source/drain connected to VDD and a drain/source connected to the input node;

the second transistor includes a PFET;
the fifth transistor includes a PFET;
the eighth transistor includes an NFET.

8. The two-stage gated-diode sense amplifier of claim 7, wherein the input node is pre-charged at VDD.

* * * * *